(12) United States Patent
Jagiella et al.

(10) Patent No.: US 7,515,090 B2
(45) Date of Patent: Apr. 7, 2009

(54) HIGH-FREQUENCY POSITION/PATH SENSOR FOR DETECTING THE APPROACH OF AN OBJECT AND METHOD FOR DETECTING THE APPROACH OF AN OBJECT

(75) Inventors: Manfred Jagiella, Notzingen (DE); Sorin Fericean, Leonberg (DE)

(73) Assignee: BALLUFF GmbH, Neuhausen (DE)

( * ) Notice: Subject to any disclaimer, the term of this patent is extended or adjusted under 35 U.S.C. 154(b) by 385 days.

(21) Appl. No.: 11/304,992

(22) Filed: Dec. 14, 2005

(65) Prior Publication Data

US 2007/0103336 A1 May 10, 2007

(30) Foreign Application Priority Data

Dec. 20, 2004 (DE) .................. 10 2004 062 801

(51) Int. Cl.
*G01S 13/56* (2006.01)
(52) U.S. Cl. .................. 342/28; 342/114; 342/126; 340/903
(58) Field of Classification Search .................. 342/27, 342/28, 114, 126; 340/903
See application file for complete search history.

(56) References Cited

U.S. PATENT DOCUMENTS

| | | | |
|---|---|---|---|
| 6,448,924 B1 * | 9/2002 | Hafer, Jr. ................ | 342/28 |
| 6,864,825 B2 * | 3/2005 | Holly ..................... | 342/13 |
| 7,012,560 B2 * | 3/2006 | Braeuchle et al. ........ | 342/70 |
| 7,119,735 B2 * | 10/2006 | Hirose et al. ............ | 342/70 |
| 7,417,585 B2 * | 8/2008 | Yamagami et al. ........ | 342/158 |
| 7,460,052 B2 * | 12/2008 | Zemany et al. ........... | 342/22 |
| 7,460,053 B2 * | 12/2008 | Zemany et al. ........... | 342/22 |
| 2003/0184467 A1 * | 10/2003 | Collins .................. | 342/22 |
| 2003/0189510 A1 * | 10/2003 | Anderton et al. ......... | 342/22 |
| 2003/0189511 A1 * | 10/2003 | Lasky et al. ............ | 342/22 |
| 2004/0150548 A1 * | 8/2004 | Walmsley ................ | 342/70 |
| 2006/0007001 A1 * | 1/2006 | Rastegar et al. ......... | 340/552 |
| 2006/0109159 A1 * | 5/2006 | Holly ..................... | 342/13 |
| 2007/0103336 A1 * | 5/2007 | Jagiella et al. .......... | 340/903 |
| 2008/0198062 A1 * | 8/2008 | Mezger et al. ........... | 342/27 |

FOREIGN PATENT DOCUMENTS

DE 4242635 A1 * 6/1994
FR 2591351 A1 * 6/1987

* cited by examiner

*Primary Examiner*—John B Sotomayor
(74) *Attorney, Agent, or Firm*—Lipsitz & McAllister, LLC

(57) ABSTRACT

A high-frequency position/path sensor for detecting the approach of an object, with a detection range in a near field, which comprises a high-frequency transmitter and a high-frequency receiver, is proposed. The high-frequency transmitter and the high-frequency receiver are arranged and configured such that a main transmitting direction and a main receiving direction lie at an angle to each other.

31 Claims, 2 Drawing Sheets

HIGH-FREQUENCY POSITION/PATH SENSOR FOR DETECTING THE APPROACH OF AN OBJECT AND METHOD FOR DETECTING THE APPROACH OF AN OBJECT

The present disclosure relates to the subject matter disclosed in German application No. 10 2004 062 801.7 of Dec. 20, 2004, which is incorporated herein by reference in its entirety and for all purposes.

BACKGROUND OF THE INVENTION

The invention relates to a high-frequency position/path sensor for detecting the approach of an object, with a detection range in a near field.

The invention further relates to a method for detecting the approach of an object.

SUMMARY OF THE INVENTION

A high-frequency position/path sensor is made available, with which the approach of an object can be reliably detected.

In one embodiment, a high-frequency transmitter and a high-frequency receiver are provided, the high-frequency transmitter and the high-frequency receiver being arranged and configured such that a main transmitting direction and a main receiving direction lie at an angle to each other.

With a corresponding arrangement and configuration of high-frequency transmitter and high-frequency receiver, a triangulation evaluation can be carried out, by means of which the approach of an object is detectable.

In particular, a combined triangulation evaluation and energy evaluation can be carried out, which enables a reliable detection.

With the corresponding high-frequency position/path sensor all objects that are electrically conductive or have a sufficiently large dielectric constant can be detected. For example, glass objects can also be detected. Magnetic properties of the object do not influence the detection results—as is the case with inductive proximity sensors. Accordingly, a position detection and/or path detection can be carried out, which is substantially independent of the material of the object to be detected, at least insofar as the corresponding object is electrically conductive.

The solution according to the invention provides a high-frequency position/path sensor which is easy to manufacture and produces good detection results. In particular, objects at distances of less than approximately 15 m can be detected. The high-frequency position/path sensor according to the invention can be used with particular advantage for distance ranges under 1 m.

In particular, the main transmitting direction is determined by the energy flux density (Poynting vector) of the transmitted high-frequency radiation.

The main receiving direction is determined by the energy flux density of the received high-frequency radiation. The main receiving direction can be adjusted by the arrangement and configuration of the high-frequency receiver.

In one embodiment, the high-frequency transmitter comprises one antenna or several antennas arranged on a first carrier. The directional pattern of the emission of the high-frequency transmitter is determined by the geometrical arrangement of the antennas and/or by the controlling of the antennas.

It is favorable for the main transmitting direction to lie perpendicular to a carrier plane of the first carrier. The angle between the main transmitting direction and the main receiving direction can thus be set in a simple way and, if required, also varied in a simple way. In particular, a geometrical variation is possible.

It is also possible for the main transmitting direction to lie at an incline to a carrier plane of the first carrier. This is achieved, in particular, by a corresponding electric controlling or electric configuration of the antenna of the high-frequency transmitter.

It can be provided that the high-frequency receiver comprises one antenna or several antennas arranged on a second carrier.

For example, the main receiving direction is perpendicular to a carrier plane of the second carrier.

Alternatively, it is also possible for the main receiving direction to lie at an incline to a carrier plane. This can be achieved, in particular, by a corresponding controlling of a receiving antenna of the high-frequency receiver or by a corresponding electric configuration.

In this case, it can be provided that the carrier plane of the high-frequency receiver and the carrier plane of the high-frequency transmitter lie on the same plane, i.e., do not lie at an angle to each other. In particular, the high-frequency transmitter and the high-frequency receiver can then be arranged on the same, in particular flat, carrier. An angle between the main transmitting direction and the main receiving direction is then set by the electric controlling or electric configuration of the antennas of the high-frequency transmitter and the high-frequency receiver.

If the carrier of the high-frequency transmitter and the carrier of the high-frequency receiver are arranged at an angle to each other, this angle then defines the angle between the main transmitting direction and the main receiving direction in a geometrical manner. It is, for example, also possible for the antenna of the high-frequency transmitter and the antenna of the high-frequency receiver to be arranged in one plane, for example, on the same carrier. An angle between the main transmitting direction and the main receiving direction is brought about by corresponding configuration of the antennas with respect to their electrical properties or by electric controlling thereof.

In particular, the angle between the carrier of the microwave transmitter and the carrier of the high-frequency receiver, insofar as it is provided, is greater than 90° and less than 180°.

It is favorable for a holding device to be provided for holding the first carrier and the second carrier in a defined position. The position sensor can thus be manufactured in a simple way. For example, with a corresponding holding device it is possible to vary the angular position.

It is favorable for the holding device to be designed such that the relative position of the first carrier and of the second carrier is settable in a fixable manner. The position sensor can thereby be adapted to a special application. The detection results can be optimized by corresponding setting.

In particular, it is advantageous for a transmitter-receiver combination which is positionable as a unit to be provided. The high-frequency transmitter and the high-frequency receiver are connected to each other such that they can be positioned as a unit. This results in a compact arrangement. Furthermore, manufacture of a corresponding high-frequency position/path sensor is simplified.

It is possible to provide a transmitter-receiver unit with deactivated reception as high-frequency transmitter. It is likewise possible to provide a transmitter-receiver unit with deactivated transmitter as high-frequency receiver. Such transmitter-receiver units are commercially available. A corresponding high-frequency position/path sensor can then be manufactured in a simple and cost-effective way.

It is favorable for an evaluating device to be provided, by means of which a triangulation evaluation and an energy evaluation can be carried out. In particular, a combined triangulation and energy evaluation is provided. This results in a good detection result. In particular, a position switch or proximity switch can thus be realized, which supplies a switching signal when a certain set switching distance is fallen short of or exceeded.

It is expedient for a continuous transmission of high-frequency radiation to be provided. In particular, an energy evaluation can thus be carried out in a simple way.

It has proven favorable for a high-frequency emission to take place in a frequency range of an authorized ISM band, for example, around 24 GHz. In such a frequency range, components are available which have the corresponding authorizations.

A coding device can be provided for coding a transmitter signal. For example, a digital modulation of the transmitter signal is provided. By means of this coding, a mutual interference of adjacently arranged high-frequency position/path sensors can be prevented, as the high-frequency receiver of a given high-frequency position/path sensor can be configured such that it receives and/or passes on only signals which are provided with the corresponding coding key (of the associated high-frequency transmitter).

Alternatively or additionally, a synchronizing device can be provided for synchronization of the high-frequency transmitter and the high-frequency receiver. This synchronizing device comprises, for example, a scanning device which scans the high-frequency transmitter and the high-frequency receiver and provides a synchronization. The mutual interference of adjacently arranged high-frequency position/path sensors can also be thereby prevented.

A frequency mixer can be provided, which convolutes a signal of the high-frequency receiver with a signal of a predetermined frequency. This is particularly advantageous when the frequency of the emitted high-frequency radiation is varied. As a result, the frequency of the high-frequency radiation received by the high-frequency receiver also varies. A direct demodulation can then only be carried out with difficulty. By means of the convolution, for example, a signal of an intermediate frequency can be generated, which is then supplied to a peak detector. A frequency variation may be expedient in order to prevent the mutual interference of adjacently arranged high-frequency position/path sensors.

Furthermore, a method for detecting the approach of an object is provided, which can be carried out in a simple and reliable way.

In one embodiment, high-frequency radiation is emitted in a main transmitting direction and detected in a main receiving direction, the main transmitting direction and the main receiving direction lying at an angle to each other.

The method according to the invention has the advantages already explained in conjunction with the high-frequency position/path sensor according to the invention.

Further advantageous embodiments have also already been explained in conjunction with the high-frequency position/ path sensor according to the invention.

In particular, the angle between main transmitting direction and main receiving direction is less than 90°. The precise angle depends on the special application. Depending on the application, different angles can provide different detection results. If the angle is selected less than 90°, a corresponding position sensor can then be constructed compactly.

In particular, the transmitting frequency is selected in a range around 24 GHz.

It is advantageous for a center axis between the main transmitting direction and the main receiving direction to be aligned in parallel with a direction of movement of the object. The main transmitting direction and the main receiving direction thus lie in a defined manner in relation to the direction of movement of the object. In turn, the approach of the object can thereby be reliably detected. In particular, a switching distance can be set and an approach with respect to the switching distance detected in a simple and reliable way.

It is, in particular, provided that the angle between the main transmitting direction and the main receiving direction is adapted to an object and/or its form of movement. For example, different angles can provide optimized results for different objects and/or different forms of movement.

It is favorable for high-frequency radiation to be transmitted continuously. As a result, an energy evaluation can, for example, be carried out in a simple way.

It is quite particularly advantageous for a combined triangulation evaluation and energy evaluation (intensity evaluation) of the received radiation to be carried out. As a result, the approach of an object can be detected in a simple and reliable way.

In order to prevent the mutual influencing of adjacent high-frequency position/path sensors, it can be provided that the emitted high-frequency radiation is coded, with different high-frequency position/path sensors being provided with different codings. It can thus be ensured that a high-frequency receiver of a high-frequency position/path sensor receives or passes on for evaluation only that signal which originates from the high-frequency transmitter associated with it.

Alternatively or additionally, it is possible to prevent the mutual interference of adjacent high-frequency position/path sensors by a high-frequency transmitter and a high-frequency receiver being synchronized. For example, these are scanned, and a synchronization is then provided.

It can, for example, also be provided that a received signal is convoluted with a signal of a defined frequency. The evaluation can thereby be facilitated. The mutual interference of different high-frequency position/path sensors can also be thereby prevented.

In one embodiment, the frequency of the emitted high-frequency radiation is varied. This can be favorable in eliminating the interference of different high-frequency position/ path sensors with one another.

The following description of preferred embodiments serves in conjunction with the drawings to explain the invention in greater detail.

DETAILED DESCRIPTION OF THE INVENTION

Figure 1:
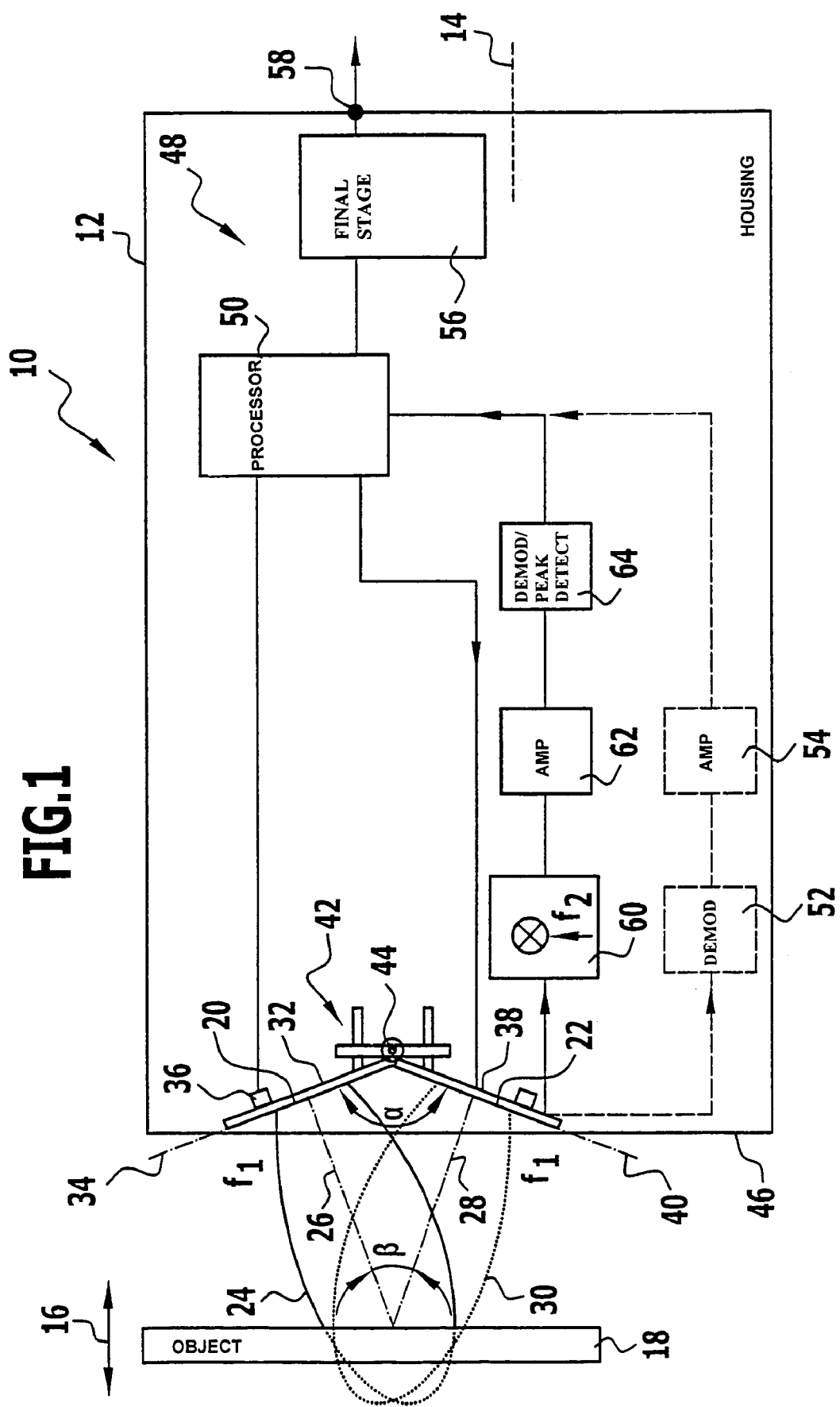
FIG. 1 shows a block diagram representation of an embodiment of a high-frequency position/path sensor according to the invention.

An embodiment of a high-frequency position/path sensor according to the invention, which is shown schematically in FIG. 1 and generally designated 10 therein, comprises a housing 12 in which the corresponding components of the high-frequency position/path sensor 10 are arranged in a protected manner.

The housing 12 comprises, for example, a housing axis 14. With this housing axis, the high-frequency position/path sensor 10 can be advantageously oriented parallel to a direction of movement 16 of an object 18 (target), whose approach is to be detected.

The high-frequency position/path sensor 10 comprises a high-frequency transmitter 20, in particular, a microwave transmitter, and a high-frequency receiver 22, in particular, a microwave receiver. The high-frequency transmitter 20 and the high-frequency receiver 22 are matched with respect to their frequency ranges. High-frequency radiation with a certain directional pattern of the emission can be emitted by the high-frequency transmitter 20. This is indicated by a radiation lobe 24 in FIG. 1. The emitted high-frequency radiation has a main transmitting direction 26, which is determined by the energy flux density (Poynting vector $\vec{S} = \vec{E} \times \vec{H}$).

The high-frequency receiver 22 is aligned so as to receive the high-frequency radiation in a main receiving direction 28. The main receiving direction 28 is determined by the Poynting vector of the microwave radiation receivable by the high-frequency receiver 22.

In accordance with the invention, it is provided that the main transmitting direction 26 and the main receiving direction 28 are at an angle β to each other. This means that the directional pattern of the emission of the high-frequency transmitter 20 (indicated by the radiation lobe 24 in FIG. 1) and a receiving pattern of the high-frequency receiver 22 (indicated by a radiation lobe 30 in FIG. 1) are at an angle to each other.

The high-frequency transmitter 20 comprises one antenna or several antennas. The high-frequency receiver 22 similarly comprises one antenna or several antennas. The main transmitting direction 26 and the main receiving direction 28 are set by arrangement and/or configuration and/or control of the antennas. For example, it is possible to set an angle between the main transmitting direction 26 and the main receiving direction 28 by corresponding phase control of antennas of a plurality of antennas.

In the embodiment shown in FIG. 1, the high-frequency transmitter 20 comprises a first carrier 32 which is substantially flat at least on one side thereof and, in particular, is in the form of a circuit board. One high-frequency antenna or several high-frequency antennas is or are arranged on this first carrier 32. These are arranged such that the main transmitting direction 26 is substantially perpendicular to a carrier plane 34 of the first carrier 32.

A control device 36 for controlling the high-frequency generation of the high-frequency transmitter 20 is connected to the first carrier 32.

The high-frequency receiver 22 comprises a second carrier 38 which is also substantially flat on at least one side thereof, and on which one receiving antenna or several receiving antennas is or are arranged. The at least one antenna is arranged on the second carrier 38 such that the main receiving direction 28 is substantially perpendicular to a carrier plane 40 of the second carrier 38.

The angle β between the main transmitting direction 26 and the main receiving direction 28 can then be set by setting the angle α between the first carrier 32 and the second carrier 38, i.e., by setting the angle α between the carrier plane 34 and the carrier plane 40. The two carriers 32 and 38 lie in a defined angular position relative to each other.

In the case of a preset high-frequency position/path sensor 10, the angle α may be fixed. It is, in particular, greater than 90° and less than 180°. The specially set angle depends, in particular, upon an application. For example, the angle depends on the distance range within which an approach of the object 18 is to be detected.

A holding device 42 may be provided for holding the two carriers 32 and 38 in a defined angular position relative to each other.

In one embodiment, the holding device 42 is designed so that the angular position of the two carriers 32 and 38 (and thus the angular position of the main transmitting direction 26 and the main receiving direction 28) is settable in a fixable manner. For this purpose, the holding device 42 comprises, for example, a pivot bearing 44, by means of which the first carrier 32 and the second carrier 38 are pivotable relative to each other.

The holding device 42 and the pivot bearing 44 are preferably designed so that a pivoting of the carriers 32 and 38 relative to each other takes place symmetrically in relation to a measuring side 46 of the high-frequency position/path sensor 10 and symmetrically in relation to the housing axis 14. (The measuring side 46 is preferably perpendicular to the housing axis 14.)

The pivoting is actuatable, for example, by means of an element which is accessible from an outer side of the housing 12. In the same way, the fixing of a certain relative angular position is actuatable from an outer side of the housing 12.

High-frequency transmitter-receiver combinations are commercially available, in which transmitting antennas and receiving antennas are arranged on the same carrier. Such combinations can be used as high-frequency transmitter 20 and high-frequency receiver 22 if the antennas that are not required (the receiving antennas in the case of high-frequency transmitter 20 and the transmitting antennas in the case of high-frequency receiver 22) are deactivated.

The high-frequency position/path sensor 10 comprises an evaluating device 48, arranged in the housing 12, with a processor 50.

The processor 50 is coupled to the high-frequency transmitter 20 and, in particular, to its control device 36.

For example, the processor 50 delivers stroboscopic pulses to the high-frequency transmitter 20. In accordance with the invention, it is, in particular, provided that the high-frequency transmitter 20 does not emit high-frequency radiation in a pulsed manner, but continuously.

In one embodiment a demodulator 52 is provided, which is coupled to the high-frequency receiver 22. The receiving signals supplied by the high-frequency receiver 22, which have the $f_1$ frequency of the high-frequency radiation emitted by the high-frequency transmitter 20, are demodulated in the demodulator 52. This results in a direct-current or direct-voltage signal.

The demodulator 52 is followed by an amplifier 54 (in particular, a direct-current or direct-voltage amplifier). This amplifier 54 is, in turn, coupled to the processor 50.

The processor 50 is preferably followed by a final stage 56 which amplifies and makes available via an output 58 a position signal which was generated by the processor 50 on the basis of the signal supplied by the high-frequency receiver 22.

The evaluating device 48 is configured, in particular, such that an output signal that is made available is a switching signal. The switching signal has two states, depending on whether the object 18 has reached a certain approaching distance or not.

The switching signal is dependent upon whether the high-frequency position/path sensor 10 is configured or set as a normally open switch or a normally closed switch.

In this context, the high-frequency position/path sensor 10 is then a position switch or proximity switch.

In an alternative embodiment, a frequency mixer 60 is coupled to the high-frequency receiver 22. In the frequency mixer 60, the signal of the high-frequency receiver 22, which has an $f_1$ frequency, is convoluted with a signal of a defined $f_2$ frequency. The output signal of the frequency mixer 60 is a signal of an $f_z$ frequency, and then $f_z = f_1 - f_2$, for example. The $f_2$ frequency is selected in dependence upon the $f_1$ frequency. In particular, the $f_2$ frequency is from the range of between zero and 100 MHz.

The frequency mixer 60 is followed by an intermediate amplifier 62.

The intermediate amplifier 62 is followed by a demodulator 64 and/or peak detector. The signal of the demodulator 64 or peak detector is then supplied to the processor 50, where the evaluation can take place.

In principle, it is possible to use high-frequency radiation in the frequency range of between 1 GHz and 1000 GHz. It has proven advantageous to work in a range around 24 GHz, as components with corresponding authorizations are available on the market in this range.

The processor 50 is connected to the high-frequency receiver 22 so as to pass an "enable" signal to the high-frequency receiver 22 for activation of the latter with respect to the high-frequency reception.

It is, in particular, provided that the $f_1$ frequency is varied by the processor 50. It is thereby ensured that neighboring high-frequency position/path sensors 10 do not influence one another mutually. When such a frequency variation is provided, it is then difficult to carry out a direct demodulation. By means of the frequency mixer 60 and a peak detector 64 a signal can then be generated, from which the processor 50 can generate, for example, a switching signal.

The method according to the invention for detecting the approach of the object 18 functions as follows:

The high-frequency transmitter 20 emits high-frequency radiation of an $f_1$ frequency in a main transmitting direction 26. As mentioned above, the $f_1$ frequency may be varied by the processor 50. The emission takes place in a range around 24 GHz, for example.

The high-frequency radiation is partially absorbed and partially reflected by the object 18. The absorbed fraction and the reflected fraction are determined by the dielectric constant of the object 18 at the $f_1$ frequency. If this is sufficiently large, a signal reflection then occurs.

If the dielectric constant is sufficiently large, a signal reflection also occurs in the case of nonconductors. For example, in the case of a glass target a signal reflection occurs, and, therefore, the approach of a glass object can be detected with the solution according to the invention.

Moreover, signal reflection is not influenced by magnetic properties of the material of the object 18.

The high-frequency receiver 22 is then arranged and configured such that it receives reflected radiation in a main receiving direction 28.

It is, in particular, provided that the high-frequency transmitter 20 emits high-frequency radiation continuously. Accordingly, when a reflection signal is present, the reception of the high-frequency radiation by the microwave receiver 22 is continuous.

The main transmitting direction 26 and the main receiving direction 28 lie at an angle to each other, which, in particular, is less than 90°.

Information on the approach of the object 18 can be obtained from the signal of the high-frequency receiver 22, which was correspondingly processed and, in particular, demodulated or was processed via a peak detector.

Owing to the angular position between the main transmitting direction 26 and the main receiving direction 28 a triangulation can be carried out, via which the approach of the object 18 is detectable. At the same time as the triangulation, an energy evaluation is also carried out in the evaluating device 48, i.e., the receiving power of the high-frequency radiation received by the microwave receiver 22 is evaluated.

The approach of the object 18 can be detected by a combined triangulation evaluation and energy evaluation. Depending on object and distance range, the angle β between the main transmitting direction 26 and the main receiving direction 28 is set or selected.

In principle, it is also possible for the evaluating device 48, in the case of a known object 18, to take its material (if it is an electrically non-conductive material) into consideration in the signal evaluation.

The approach of the object 18 can be detected by the position sensor 10 in a distance range which lies in a near range below a distance of 15 m from the measuring side 46. It is expected that detection of an approach can be carried out at least in a distance range of up to 2 m from the measuring side 46. The method according to the invention is particularly advantageous for distance ranges below 1 m.

Figure 2:
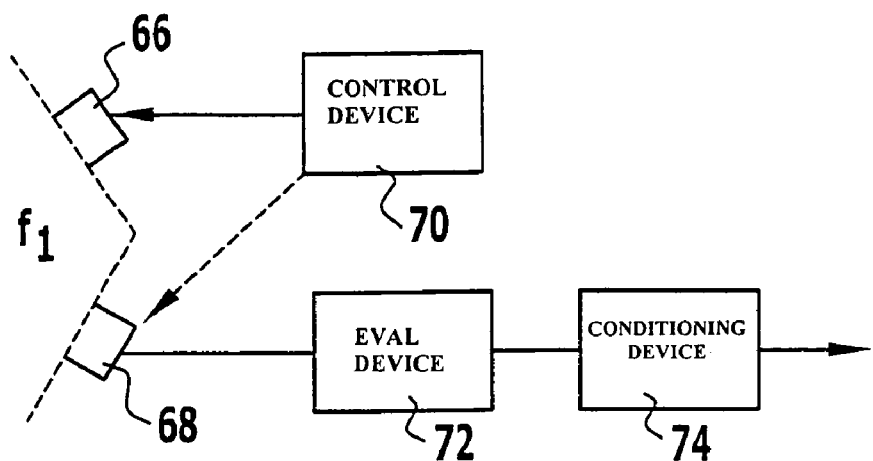
FIG. 2 shows a schematic partial representation of an embodiment of a high-frequency position/path sensor according to the invention.

A high-frequency position/path sensor according to the invention, which, for example, is configured as microwave position/path sensor, comprises, as explained with reference to FIGS. 2 to 4, a high-frequency transmitter 66 and a high-frequency receiver 68, with the main transmitting direction of the high-frequency transmitter 66 and the main receiving direction of the high-frequency receiver 68 lying at an angle β to each other. This relative angular position can be produced geometrically and/or via electronic control or configuration of the high-frequency transmitter 66 and the high-frequency receiver 68.

Associated with the high-frequency transmitter 66 is a control device 70, via which it is controlled.

The control device 70 may, for example, comprise a coding device by means of which the transmitter signal of the high-frequency transmitter 66 is coded. For example, a digital modulation is provided for the coding.

It is thereby possible to impress a coding key on the transmitter signal, as a result of which the associated high-frequency receiver 68 receives only signals coming from the high-frequency transmitter 66, or, of the signals received, only those that originate from transmitter signals of the high-frequency transmitter 66 are further processed.

Associated with the high-frequency receiver 68 is an evaluating device 72 for the signals of the high-frequency receiver 68.

Associated with the evaluating device 72 is a conditioning device 74 for the output signals of the evaluating device 72, via which signals are generated, which can be delivered, for example, via an output of the high-frequency position/path sensor.

It is, in principle, also possible for the control device 70 to be configured such that the high-frequency transmitter 66 and the high-frequency receiver 68 are scannable and synchronizable via it. For this purpose, it comprises a corresponding synchronizing device. By means of such scanning and synchronizing of the high-frequency transmitter 66 and the high-frequency receiver 68 of a high-frequency position/path sensor it is possible to prevent different high-frequency position/path sensors from interfering with one another.

Figure 3:
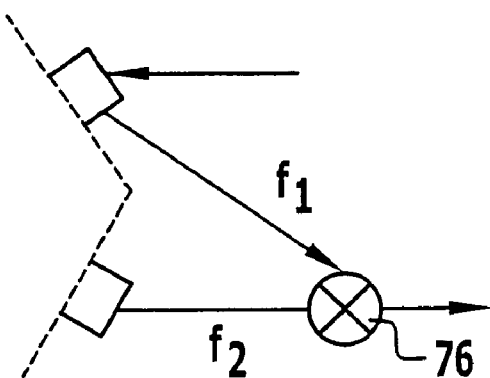
FIG. 3 shows a schematic partial representation of a further embodiment.

In one embodiment, as shown schematically in FIG. 3, a high-frequency transmitter transmits signals of a fixed $f_1$ frequency. An associated high-frequency receiver receives signals at a fixed $f_2$ receiving frequency. A corresponding modulation is carried out via a frequency mixer 76 in order to correlate the signals with one another.

Figure 4:
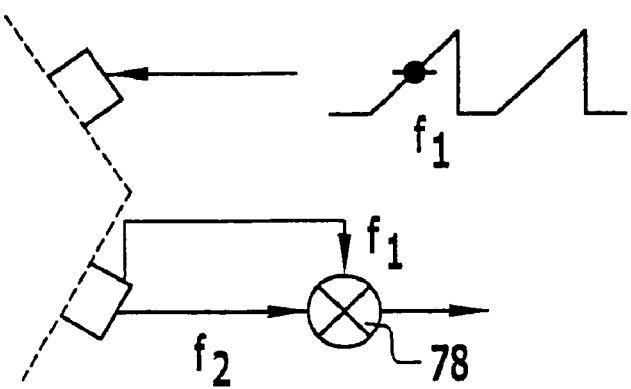
FIG. 4 shows a schematic partial representation of a further embodiment.

In an alternative embodiment, as shown in FIG. 4, a frequency range is passed through (frequency sweep) for the transmitter signal of a high-frequency transmitter. The frequency sweep has, for example, a mean $f_1$ frequency.

An associated high-frequency receiver receives at the $f_2$ receiving frequency, and in a frequency mixer 78 a frequency mixing is carried out with the $f_1$ frequency as center frequency of the frequency sweep. In this way, too, the mutual controlling influence of different high-frequency position/path sensors can be prevented.

The invention claimed is:

1. High-frequency position/path sensor for detecting the approach of an object, with a detection range in a near field, comprising:
    a housing;
    a high-frequency transmitter arranged in said housing;
    a high-frequency receiver arranged in said housing; and
    at least one of a coding device for coding a transmitter signal and a synchronizing device for synchronizing the high-frequency transmitter and the high-frequency receiver;
    the high-frequency transmitter and the high-frequency receiver being arranged and configured such that a main transmitting direction and a main receiving direction lie at an angle ($\beta$) to each other.

2. High-frequency position/path sensor in accordance with claim 1, wherein the high-frequency transmitter is arranged and configured such that the main transmitting direction is determined by an energy flux density of high-frequency radiation emitted from the high-frequency transmitter.

3. High-frequency position/path sensor in accordance with claim 1, wherein the high-frequency receiver is arranged and configured such that the main receiving direction is determined by an energy flux density of high-frequency radiation received by the high-frequency receiver.

4. High-frequency position/path sensor in accordance with claim 1, wherein the high-frequency transmitter comprises one antenna or several antennas arranged on a first carrier.

5. High-frequency position/path sensor in accordance with claim 4, wherein the high-frequency transmitter is arranged and configured such that the main transmitting direction lies perpendicular to a carrier plane of the first carrier.

6. High-frequency position/path sensor in accordance with claim 4, wherein the high-frequency transmitter is arranged and configured such that the main transmitting direction lies at an incline to a carrier plane of the first carrier.

7. High-frequency position/path sensor in accordance with claim 1, wherein the high-frequency receiver comprises one antenna or several antennas arranged on a second carrier.

8. High-frequency position/path sensor in accordance with claim 7, wherein the high-frequency receiver is arranged and configured such that the main receiving direction is perpendicular to a carrier plane of the second carrier.

9. High-frequency position/path sensor in accordance with claim 7, wherein the high-frequency receiver is arranged and configured such that the main receiving direction lies at an incline to a carrier plane of the second carrier.

10. High-frequency position/path sensor in accordance with claim 9, wherein:
    the high-frequency transmitter comprises one antenna or several antennas arranged on a first carrier,
    the high-frequency receiver comprises one antenna or several antennas arranged on a second carrier, and
    a carrier plane of the first carrier and a carrier plane of the second carrier lie on the same plane.

11. High-frequency position/path sensor in accordance with claim 1, wherein:
    the high-frequency transmitter comprises one antenna or several antennas arranged on a first carrier,
    the high-frequency receiver comprises one antenna or several antennas arranged on a second carrier, and
    the first carrier and the second carrier are arranged at an angle ($\alpha$) to each other.

12. High-frequency position/path sensor in accordance with claim 11, wherein the angle ($\alpha$) is greater than 90° and less than 180°.

13. High-frequency position/path sensor in accordance with claim 1, wherein:
    the high-frequency transmitter comprises one antenna or several antennas arranged on a first carrier,
    the high-frequency receiver comprises one antenna or several antennas arranged on a second carrier, and
    a holding device is provided for holding the first carrier and the second carrier in a defined position.

14. High-frequency position/path sensor in accordance with claim 13, wherein the holding device is adapted such that the position of the first carrier and of the second carrier is settable in a fixable manner.

15. High-frequency position/path sensor in accordance with claim 1, wherein the high-frequency transmitter and the high-frequency receiver comprise a transmitter-receiver combination, which is positionable as a unit.

16. High-frequency position/path sensor in accordance with claim 1, wherein the high-frequency transmitter comprises a transmitter-receiver unit with deactivated reception.

17. High-frequency position/path sensor in accordance with claim 1, wherein the high-frequency receiver comprise a transmitter-receiver unit with deactivated transmitter.

18. High-frequency position/path sensor in accordance with claim 1, further comprising an evaluating device for carrying out a triangulation evaluation and an energy evaluation.

19. High-frequency position/path sensor in accordance with claim 1, wherein the high-frequency transmitter is adapted to provide a continuous emission of high-frequency radiation.

20. High-frequency position/path sensor in accordance with claim 1, wherein the high-frequency transmitter is adapted to provide a high-frequency emission in an authorized ISM band.

21. High-frequency position/path sensor in accordance with claim 1, further comprising a frequency mixer for convoluting a high-frequency receiver signal with a signal of a specified frequency.

22. High-frequency position/path sensor in accordance with claim 1, further comprising a demodulator.

23. Method for detecting the approach of an object, comprising:
    emitting high-frequency radiation from a high-frequency transmitter in a main radiating direction,
    detecting the high-frequency radiation by a high-frequency receiver in a main receiving direction, and
    at least one of (i) coding the emitted high-frequency radiation and (ii) synchronizing the high-frequency transmitter and the high-frequency receiver,
    wherein:
        the high-frequency transmitter and high-frequency receiver are arranged in a housing, and the main radiating direction and the main receiving direction lying at an angle to each other.

24. Method in accordance with claim 23, wherein the angle is less than 90°.

25. Method in accordance with claim 23, wherein the transmitting frequency is selected in a range around 24GHz.

26. Method in accordance with claim 23, wherein a center axis between the main transmitting direction and the main receiving direction is aligned in parallel with a direction of movement of the object.

27. Method in accordance with claim 23, wherein the angle between the main transmitting direction and the main receiving direction is adapted to the object and/or a form of movement of the object.

28. Method in accordance with claim 23, wherein the high-frequency radiation is emitted continuously.

29. Method in accordance with claim 23, wherein a combined triangulation evaluation and energy evaluation of the received radiation is carried out.

30. Method in accordance with claim 23, wherein a received signal is convoluted with a signal of a defined frequency.

31. Method in accordance with claim 23, wherein a frequency of the emitted high-frequency radiation is varied.

* * * * *